(12) United States Patent
Zeng et al.

(10) Patent No.: US 7,709,934 B2
(45) Date of Patent: May 4, 2010

(54) PACKAGE LEVEL NOISE ISOLATION

(75) Inventors: Xiang Yin Zeng, Shanghai (CN);
Jiangqi He, Chandler, AZ (US);
Guizhen Zheng, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 154 days.

(21) Appl. No.: 11/647,897

(22) Filed: Dec. 28, 2006

(65) Prior Publication Data

US 2008/0157294 A1  Jul. 3, 2008

(51) Int. Cl.
*H01L 23/552* (2006.01)
*H01L 23/58* (2006.01)
*H01L 23/62* (2006.01)
*H01L 23/053* (2006.01)
*H01L 23/12* (2006.01)
*H01L 23/48* (2006.01)
*H01L 23/52* (2006.01)
*H01L 29/40* (2006.01)

(52) U.S. Cl. ............... 257/659; 257/665; 257/700; 257/746; 257/E23.114

(58) Field of Classification Search ............ 257/700, 257/746, 659, 665, E23.114
See application file for complete search history.

(56) References Cited

U.S. PATENT DOCUMENTS

| | | | |
|---|---|---|---|
| 5,410,173 A * | 4/1995 | Kikushima et al. | 257/368 |
| 6,272,020 B1 * | 8/2001 | Tosaki et al. | 361/763 |
| 6,369,443 B1 * | 4/2002 | Baba | 257/700 |
| 6,407,929 B1 * | 6/2002 | Hale et al. | 361/763 |
| 6,594,153 B1 * | 7/2003 | Zu et al. | 361/792 |
| 6,650,456 B2 * | 11/2003 | Judd et al. | 359/245 |
| 6,920,051 B2 * | 7/2005 | Figueroa et al. | 361/763 |
| 7,075,163 B2 * | 7/2006 | Yoshida et al. | 257/428 |
| 2003/0213619 A1 * | 11/2003 | Denzene et al. | 174/261 |
| 2004/0018658 A1 * | 1/2004 | Mano | 438/106 |
| 2006/0103004 A1 * | 5/2006 | Sakai et al. | 257/700 |
| 2006/0110859 A1 * | 5/2006 | Shigemura et al. | 438/125 |
| 2006/0133057 A1 * | 6/2006 | McGregor et al. | 361/763 |
| 2007/0242440 A1 * | 10/2007 | Sugaya et al. | 361/762 |
| 2008/0102565 A1 * | 5/2008 | Zeng et al. | 438/122 |
| 2008/0136716 A1 * | 6/2008 | Annamaa et al. | 343/702 |

FOREIGN PATENT DOCUMENTS

JP  03014284 A  *  1/1991

* cited by examiner

*Primary Examiner*—Ida M Soward
(74) *Attorney, Agent, or Firm*—Blakely, Sokoloff, Taylor & Zafman LLP

(57) ABSTRACT

A package may include a substrate provided with noise absorbing material. The noise absorbing material may absorb noise from a signal path in the substrate to prevent the noise from reaching other signals or signal paths.

14 Claims, 6 Drawing Sheets

PACKAGE LEVEL NOISE ISOLATION

BACKGROUND

One method to reduce noise coupling in a radio frequency (RF) package is to increase space in the radio frequency (RF) package. Unfortunately, the method may result in an undesirable increase in package area. Another method to reduce noise coupling may utilize band-gap structure for noise isolation. However, the band-gap structure may also consume an increased package area.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

Figure 1:
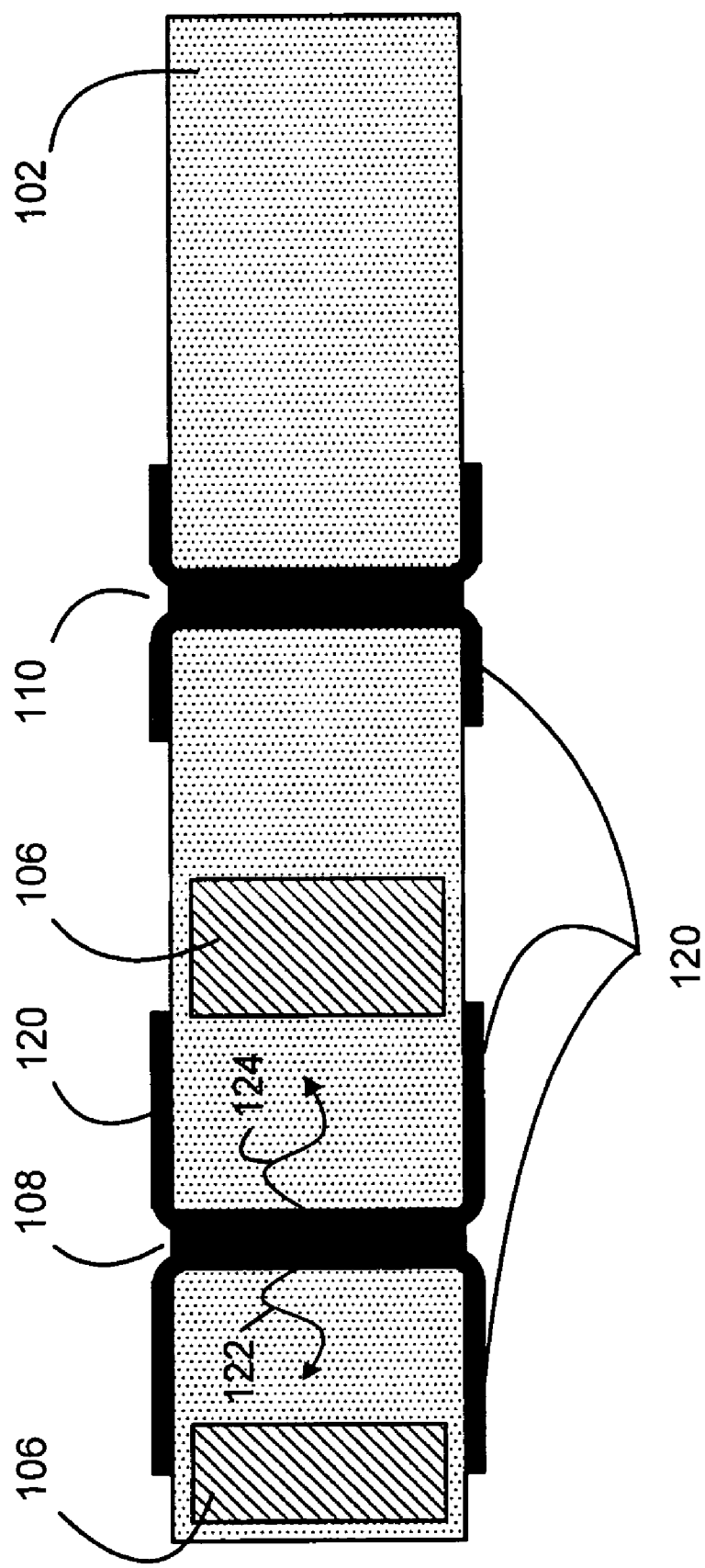
FIG. 1 is a schematic diagram illustrating an embodiment of a substrate that comprises noise absorbing material.

In the following detailed description, references is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention.

In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numbers refer to the same or similar functionality throughout the several views.

References in the specification to "one embodiment", "an embodiment", "an example embodiment", and other similar references indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The following description includes terms, such as top, bottom, upper, lower, first, and second, which are used for descriptive purposes only and are not to be construed as limiting.

FIG. 1 illustrates an embodiment of a substrate 102, in which noise absorbing material 106 may be provided. In one embodiment, noise absorbing material 106 may be disposed or provided between a first plated through hole (PTH) 108 and a second PTH 110 in the substrate 102. PTHs 108 and 110 may be coupled with one or more conductive layers 120 on either or both sides of the substrate 102. In one embodiment, the conductive layers 120 may be used to form interconnects, such as patterned metal layers, bond pads, bond fingers, solder ball lands, routings, and wirings. In one embodiment, the noise absorbing material 106 may absorb a noise from the PTH 108. For example, the noise absorbing material 106 may comprise electromagnetic absorbing material to prevent the electromagnetic energies 122 and 124 of the PTH 108 from interfering with the operation of the second PTH 110. In other embodiments, noise absorbing material 106 may comprise any other materials that may absorb noise. While the embodiment of FIG. 1 utilizes PTHs 108 and 110 as signal paths, in some embodiments, other suitable signal paths may be applied. For example, interconnects such as vias, conductive or metal layers, and I/O terminals may be utilized. In one embodiment, noise absorbing material 106 may be arranged to surround a signal path to prevent noise of the signal path from propagating to another signal path. In one embodiment, the noise absorbing material 106 may comprise electromagnetic absorbing material. For example, the noise absorbing material 106 may comprise dielectric or soft-magnetic materials with a loss tangent, composite materials, mixtures of dielectric (e.g., carbon black or aluminium flake), soft magnetic (e.g., ferrite or carbonyl iron) particles, ferrite ceramics, or other suitable noise absorbing material.

Figure 2A:
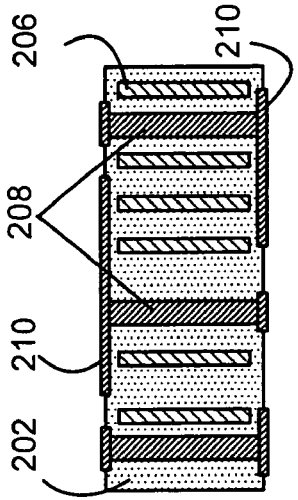
FIGS. 2A-2C are schematic diagrams illustrating an exemplary method of providing noise absorbing material in a substrate.
Figure 2B:
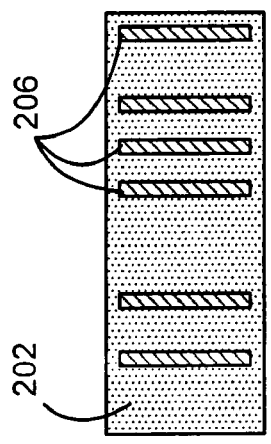
Figure 2C:
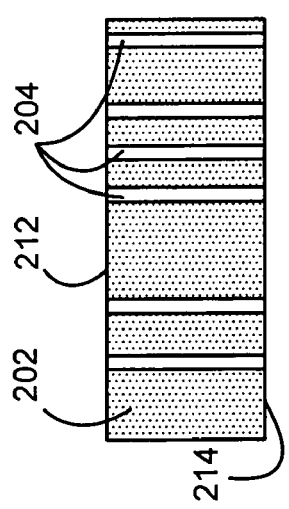

FIGS. 2A-2C are side cross-sectional views that illustrate an exemplary embodiment of a method to provide noise absorbing material in a substrate. With reference to FIG. 2A, a substrate 202 is illustrated. Any suitable substrate may be utilized, including flex substrates such as folded flex substrates or flexible polyimide tape, laminate substrates such as bismaleimide triazine (BT) substrates, buildup substrates, ceramic substrates, silicon on sapphire (SOS) substrates, or multi-layered substrates. In another embodiment, the substrate 202 may comprise a first main surface 212 and a second main surface 214.

As shown in FIG. 2A, a set of openings 204 may be provided in the substrate 202. The set of openings 204 may include one of more openings. In other embodiments, other empty space such as holes, cavities, gaps, slits, hollows may be utilized. In one embodiment, the openings 204 may be prepared by, e.g., drilling, punching, puncturing, piercing, etching, or any other hole-making methods. In another embodiment, the openings 204 may be formed via laser. The openings 204 may be insulated from interconnects that may be formed in or on the substrate. In another embodiment, the openings 204 may be formed where plated through holes (PTH) are absent. In yet another embodiment, the openings 204 may be provided to surround one or more signal paths, e.g., signal paths for RF signals. In another embodiment, the openings 204 may be formed in queue, circular, array, matrix or other arrangements.

In one embodiment, each of the openings 204 may have identical dimensions; however, some embodiments may utilize openings with different dimensions. In another embodiment, the one or more openings 204 may have a dimension similar to or equal to that of a PTH. In yet another embodiment, the openings 204 may have geometrical cross-sectional shapes, such as circular, elliptical, or open ended circular. However, some embodiments may utilize openings with irregular shapes or any other shapes that may isolate a signal path from another signal path.

Referring to FIG. 2A, in one embodiment, the one or more openings 204 may be formed straightly; however, some embodiments may utilize inclined openings. For example, the openings may zigzag through the substrate, or the openings may be drilled in other directions. In another embodiment, the one or more openings 204 may have the same geometrical dimension from top to bottom; however, in some embodiments, the geometrical dimension of an opening 204 may vary arbitrarily. In anther embodiment, the openings 204 may penetrate through the substrate 202; however, some embodiments may comprise openings that may not reach the lower surface 114. In another embodiment, each opening 204 may locate at any depth of the substrate 202.

As shown in FIG. 2B, noise absorbing material 206 may be filled or implanted into the one or more openings 204. In one embodiment, noise absorbing material 206 may absorb electromagnetic energy. In another embodiment, noise absorbing material 206 may comprise dielectric or soft-magnetic materials with an loss tangent, composite materials, mixtures of dielectric (e.g., carbon black or aluminium flake), soft magnetic (e.g., ferrite or carbonyl iron) particles, ferrite ceramics, or other suitable noise absorbing material. In one embodiment, noise absorbing material 206 may not reach the upper and/or lower main surfaces 212 and 214. In another embodiment, noise absorbing material 206 may not contact one or more conductive layers or interconnects that are formed on the upper and/or lower surfaces 212 and 214; however, in some embodiments, noise absorbing material 206 may be insulated or separated from any buildup layer on the substrate 202.

FIG. 2C illustrates a set of signal paths comprising one or more signal paths provided in the substrate 202. In one embodiment, one or more openings 208 may be formed in the substrate 202. For example, the one or more openings 208 may be through holes. In another embodiment, the one or more openings 208 may be plated or filled with one or more metals or any other conductive materials to form one or more PTHs.

In another embodiment, one or more conductive layers 210 may be provided on top and/or bottom of the substrate 202. For example, the conductive layers 210 may comprise interconnects, routings, and wirings. The top and/or bottom conductive layers 210 may be coupled with the PTHs 208 to transmit signals. In one embodiment, the signals may comprise RF signals. In one embodiment, noise absorbing material 206 may be separated from the PTHs 208 and/or the conductive layers 210. While the embodiment of FIG. 2C uses PTHs 208, in some embodiments, any other signal paths may be utilized.

Figure 3A:
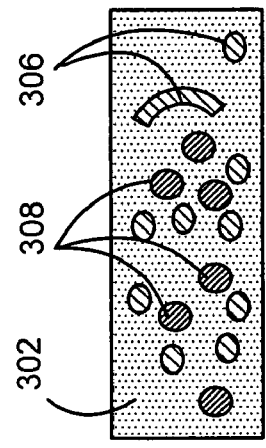
FIGS. 3A-3C are schematic diagrams showing another embodiment of a method of providing noise absorbing material in a substrate.
Figure 3B:
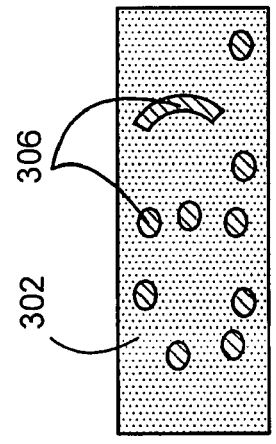
Figure 3C:
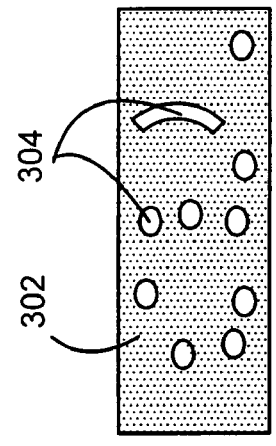

FIGS. 3A-3C are top cross-sectional views that show additional embodiments of a substrate having noise absorbing material. As shown in FIG. 3A, one or more openings 304 may be provided in a substrate 302. In another embodiment, the one or more openings 304 may surround the areas where signals may pass. With reference to FIG. 3B, noise absorbing material 306 may be deposited or implanted in the one or more openings 304.

FIG. 3C illustrates one or more PTHs 308 that are provided in the substrate 302. In one embodiment, the openings 304 may be arranged to surround one or more PTHs 308; however, in some embodiments, the openings 304 may be arranged in queue, array, matrix, or any other manner. In another embodiment, noise absorbing material 306 may be located to absorb noise or electromagnetic energy from a signal on a PTH 308 to prevent the noise or energy from interfering with other signals. In some embodiments, noise absorbing material 306 may be used to isolate signals, e.g., RF signals, to reduce noise coupling among the signals. The openings 304 may be formed in any suitable shape, e.g., a portion of a circular of FIG. 3C. In another embodiment, noise absorbing material 306 may be electrically isolated from any conductive parts or signal paths, e.g., PTH, in the substrate 302.

Figure 4A:
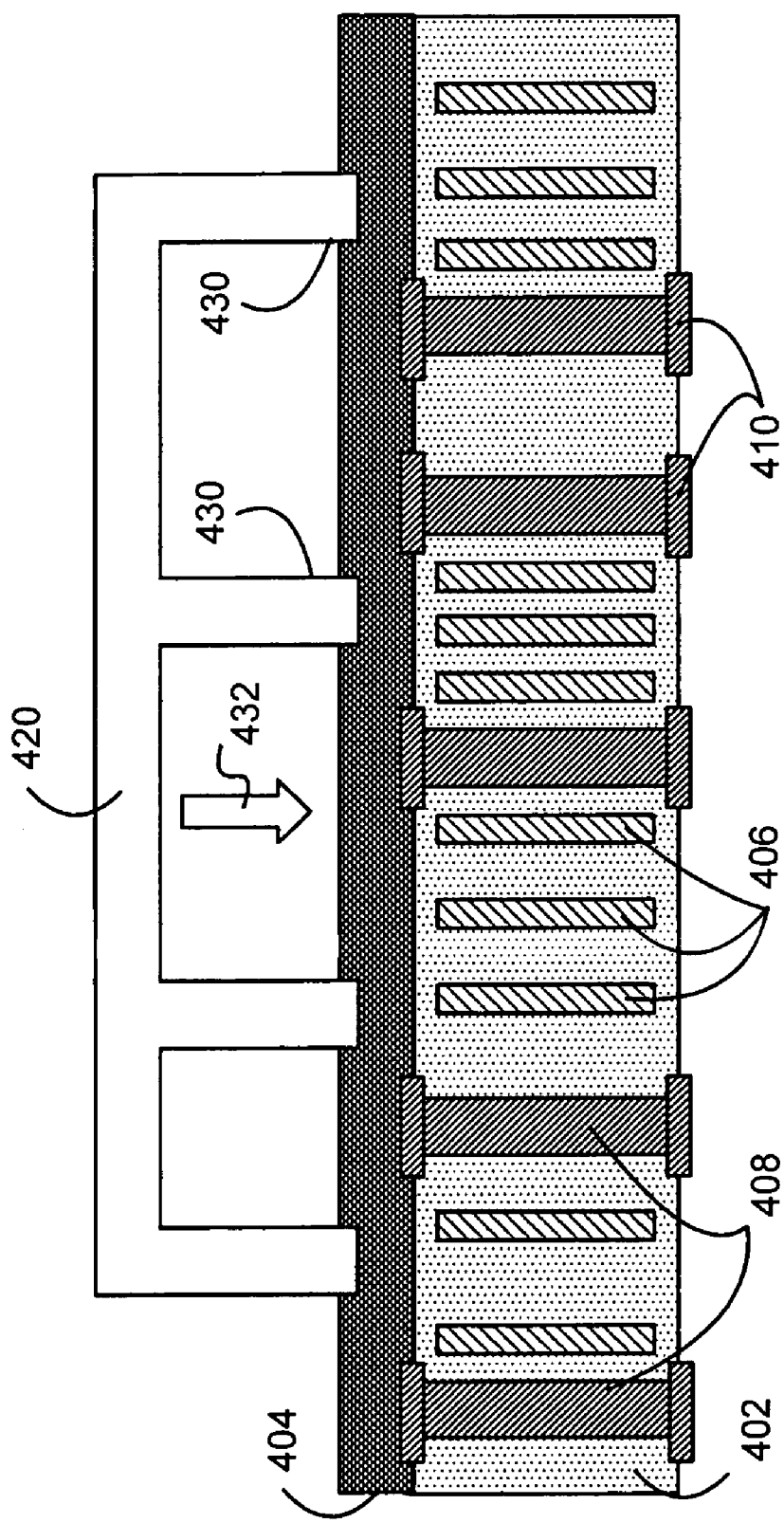
FIGS. 4A and 4B are schematic diagrams of an embodiment of a method of providing noise absorbing material in a buildup layer.
Figure 4B:
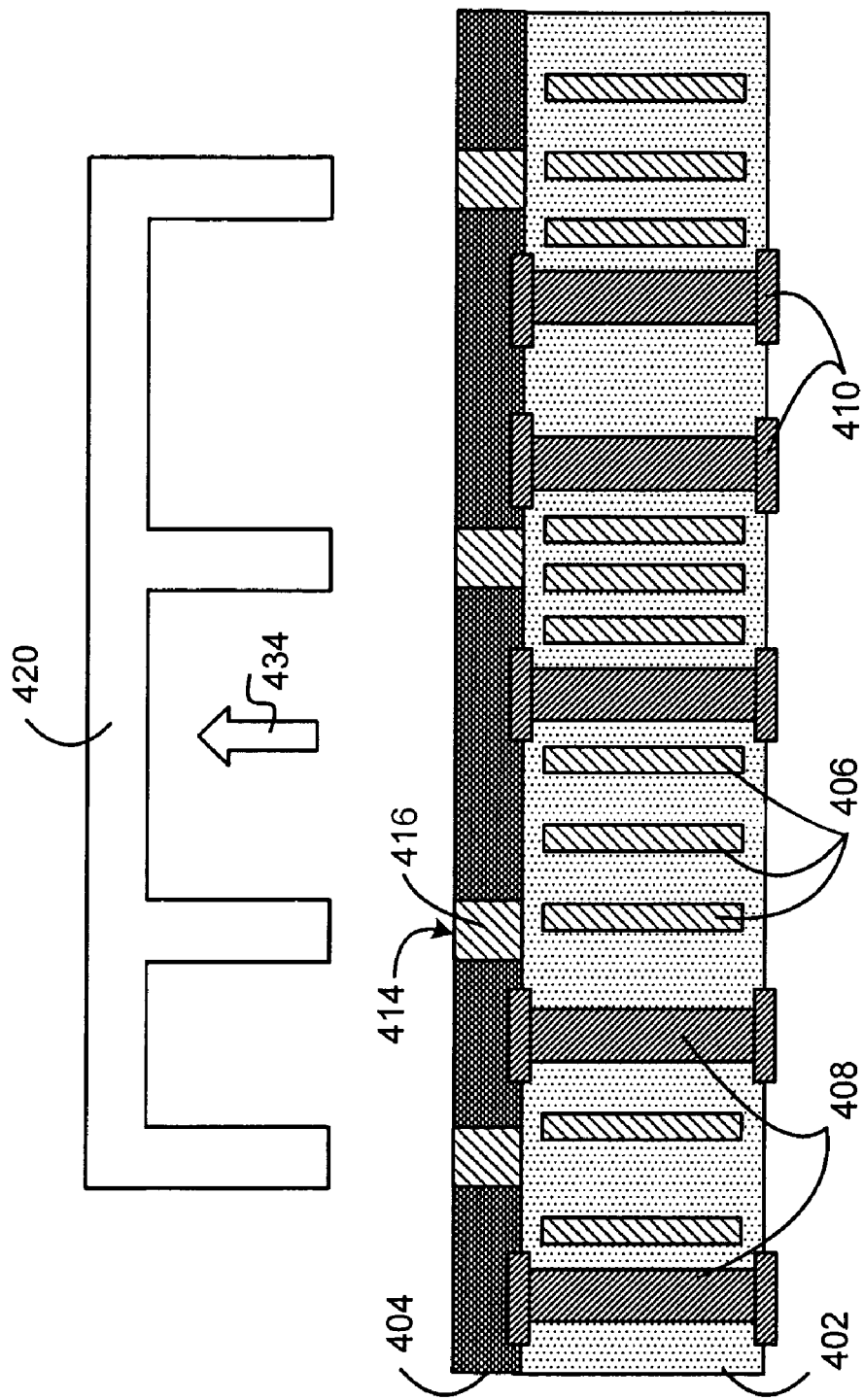

FIGS. 4A and 4B illustrate an embodiment of a method to provide noise absorbing material, such as a buildup layer 404. In one embodiment, the buildup layer 404 may be attached or mounted on a substrate 402. As shown in FIG. 4A, in one embodiment, one or more PTHs 408 may be provided in the substrate 402. The PTHs 408 may be coupled to one or more metal or conductive layers 410 on a top and/or a bottom side of the substrate 402. In one embodiment, the PTHs 408 may be used to transfer one or more signals, e.g., RF signals. In another embodiment, noise absorbing material 406 may be provided in the substrate 402 to surround one or more PTHs 408. For example, noise absorbing material 406 may be added in a manner similar to that as shown in FIGS. 2A-2C and/or 3A-3C. In one embodiment, noise absorbing material 406 may be isolated from any PTH 408 or conductive layer 410.

Referring to FIG. 4A, in one embodiment, the buildup layer 404 may cover one or more conductive layers 410. For example, the buildup layer 404 may comprise a dielectric layer, an intermediate layer, an insulating layer, or any other buildup layer. In one embodiment, the buildup layer 404 may be in liquid state. In another embodiment, the buildup layer 404 may be flowable. As shown in FIG. 4A, a model, mold or frame 420 may be applied to the buildup layer 404 to form one or more openings 414 of FIG. 4B. In one embodiment, the model 420 may be patterned to form the one or more openings 414 that may selectively surround one or more signal paths. For example, the signal paths may comprise one or more PTHs 408 and/or one or more conductive layers 410.

As shown in FIG. 4A, in one embodiment, the model 420 may be moved toward the buildup layer 404, so that one or more lower ends 430 of the model 420 may be inserted into the buildup layer 404. In another embodiment, the model 420 may be pressed in a direction as shown by arrow 432 to embed the lower ends 430 into the buildup layer 404. In another embodiment, the model 420 may form one or more openings 414 that have the same depth; however, in some embodiments, the depths of the openings 414 may vary. For example, the lower ends 430 may be molded to have the same or different lengths.

In another embodiment, the lower ends 430 may be formed to have various shapes. For example, the lower ends 430 may be formed as one or more protrusions that may be arranged in a queue, circle, array, or matrix. In another embodiment, a lower end 430 may be formed in a closed or open ended shape. For example, the lower end 430 may have any suitable a shape of ring, circular, open ended ring, loop, triangle, square, polygon, or a combination thereof. For example, the lower ends of the model 420 may be formed in two concentric rings, or the two rings may be separated or overlapped.

As shown in FIG. 4A, the lower ends 430 of the model 420 may be dipped or immersed into the buildup layer 404 at a suitable depth of the buildup layer 404. Then, the buildup layer 404 may be cured, solidified or hardened. For example, the buildup layer may be cured to be in a solid state. The time and/or the temperature for curing may be varied according to different materials of the buildup layer 404. For example, an example of the cure temperature may be 100-200 Celsius degrees; however, in some embodiments, other suitable times or temperatures may be utilized.

Referring now to FIG. 4B, in one embodiment, the model 420 may be removed from the cured buildup layer, so that one or more openings 414 may be left in the buildup layer 404. For example, the model 420 may be lifted upward, e.g., in a direction as shown by arrow 434, to form the one or more openings 414. Examples of the openings 414 may refer to the embodiments as described with regard to FIGS. 2A-2C and FIGS. 3A-3C. In one embodiment, noise absorbing material 416 may be filled in the one or more openings 414. In another embodiment, the one or more openings 414 may be arranged to surround or isolate each signal path. The noise absorbing material 416 may absorb noise or electromagnetic energy from a signal to prevent the noise or energy from reaching any other signal. In another embodiment, the noise absorbing material 416 may be separated from the PTHs 408 and the conductive layers 410, or any other physical layers in/on the substrate 402.

While the methods of FIGS. 2A-2C, 3A-3C and 4A-4B are illustrated to comprise a sequence of processes, the method in some embodiments may perform illustrated processes of the method in a different order. For example, one or more PTHs and/or conductive layers may be provided before and/or after providing noise absorbing materials. Further, while the embodiments as shown in the figures are illustrated to comprise a certain number of openings, PTHs, or conductive layers, etc., some embodiments may apply to any number of openings.

Although the embodiments as shown in FIGS. 4A and 4B provide noise absorbing material in a substrate and a buildup layer in different manners; however, in some embodiments, noise absorbing material may be provided in the buildup layer in the same manner as that has been described with regard to the substrate. For example, noise absorbing material may be filled in one or more openings that are drilled in the buildup layer in a solid state. In another embodiment, a method may comprise mounting the buildup layer on the substrate and drilling one or more openings in the buildup layer and the substrate. For example, some of the openings in the bulildup layer may penetrate through the buildup layer and reach a depth of the substrate. In some embodiments, some of the openings in a substrate may be extended to a buildup layer on the substrate.

Figure 5:
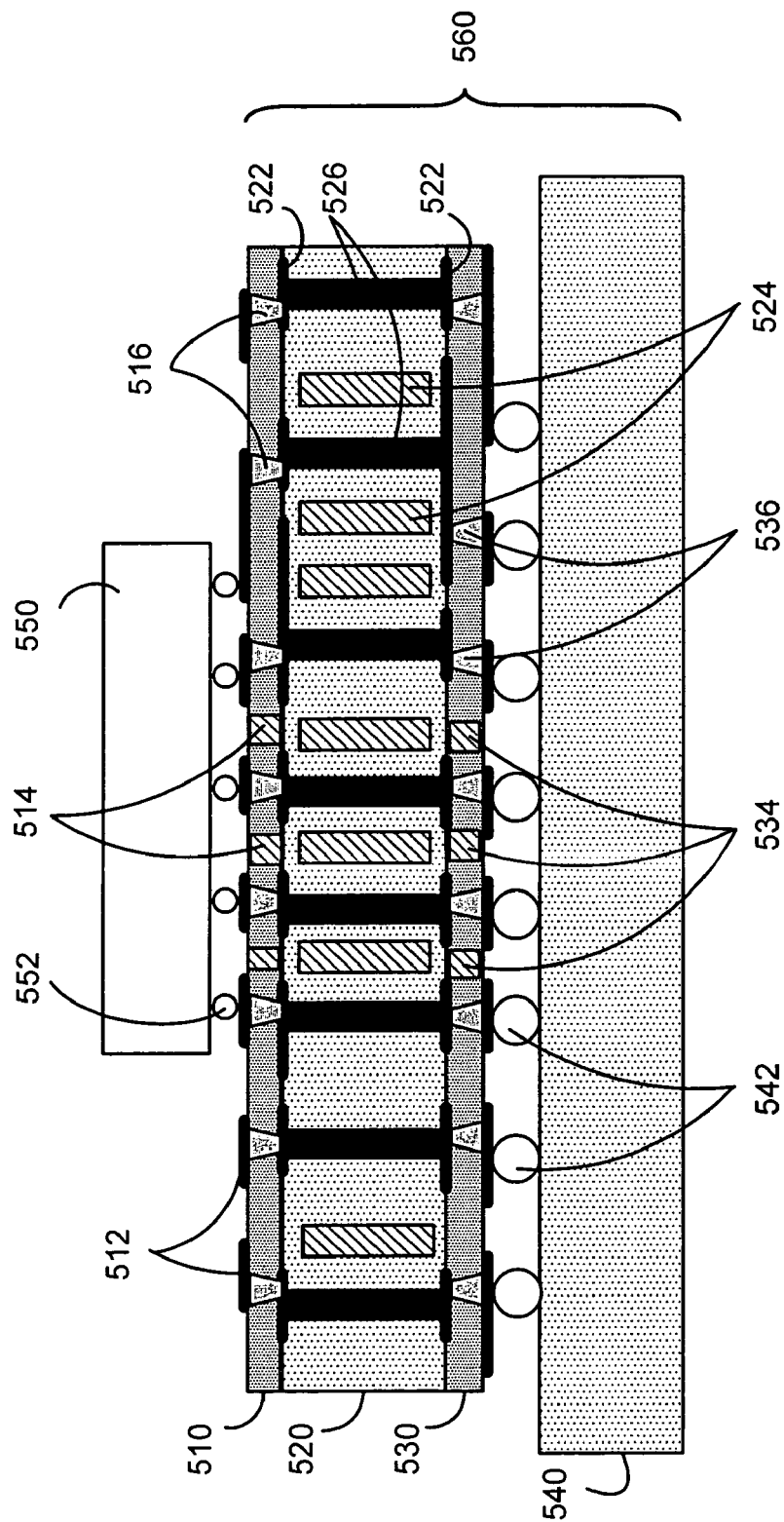
FIG. 5 is a schematic diagram showing an embodiment of a package.

FIG. 5 illustrates an embodiment of a package 500 that may comprise a four-layered substrate 560. Referring to FIG. 5, in one embodiment, the four-layered substrate 560 may comprise a first buildup layer 510, a first substrate 520, a second buildup layer 530, and a second substrate 540. Any suitable substrate may be utilized for the second substrate 540, including a printed circuit board (PCB) or a printed wiring board (PWB); however, other examples for the second substrate 540 may comprise flex substrates, laminate substrates, buildup substrates, or ceramic substrates. In one embodiment, the first substrate 520 may be disposed on the second substrate 540. Any suitable substrate may be utilized for the first substrate 520, including flex substrates such as folded flex substrates or flexible polyimide tape, laminate substrates such as bismaleimide triazine (BT) substrates, buildup substrates, or ceramic substrates.

With reference to FIG. 5, in one embodiment, one or more PTHs 526 may be provided in the first substrate 520. In another embodiment, one or more interconnects 522 may be disposed on either or both sides of the first substrate 520. Any suitable interconnects may be utilized, including patterned metal layers, bond pads, bond fingers, solder ball lands, routings, wirings, or any other interconnects. Each PTHs 526 may be coupled to one or more interconnects 522 that may each be coupled to one or more vias 516 or 536. In one embodiment, vias 516 may be formed in a first buildup layer 510 provided on an upper side of the first substrate 520 and vias 536 may be provided in a second buildup layer 530 provided on a lower side of the first substrate 520. The vias 516 and 536 may be filled with conductive material. While FIG. 5 illustrate using vias 516 and 536, in some embodiment, other suitable interconnects may be utilized to form signal paths.

Referring to FIG. 5, an IC module 550 may be coupled with interconnects 512 on the first buildup layer 510 by one or more bumps 552; however, in some embodiments, other interconnects may be utilized, including land grid arrays. In one embodiment, one or more bump pads (not shown) may be configured on the lower side of the IC module 550 for the bumps 552; however, some embodiment may utilize any other interconnects that may electrically connect to the IC module 550. For example, the IC module 550 may be configured for conductive adhesive film, conductive protrusions, or any other connectional material. Examples of the IC module 550 may comprise flash memory, static random access memory (SDRAM), digital signal processor (DSP), application specific integrated circuit (ASIC), logic circuits, or any other circuits or devices.

As shown in FIG. 5, noise absorbing material 524 may be disposed in the first substrate 520. In one embodiment, the noise absorbing material 524 may be arranged to surround one or more PTHs 526 in the first substrate 520 to absorb noise from each PTH 526, on which signals may pass. In another embodiment, noise absorbing material 514 may be provided in the first buildup layer 510, and noise absorbing material 534 may be provided in the second buildup layer 530. Any suitable noise absorbing material may be utilized, including electromagnetic absorbing material.

In one embodiment, the noise absorbing material 514, 524 and 534 may not come into contact with any signal paths or interconnects, such as vias 516 and 536, PTHs 526 or interconnects 512, 522, and 532. In another embodiment, the arrangement of the noise absorbing material 514, 524 and 534 may be similar to the embodiments illustrated in FIGS. 1, 2A-2C, 3A-3C, 4A and 4B. In another embodiment, more noise absorbing material may be provided to surround a signal path for a RF signal than for a non-RF signal. For example, more openings with noise absorbing material may be provided around a RF signal path than a non-RF signal. In another embodiment, a non-RF signal path may not require noise absorbing material.

While FIG. 5 shows an embodiment of a four-layered substrate, in some embodiments, other substrate or multi-layered substrates with a different number of layers, e.g., one or more, may be utilized. In other embodiments, a different arrangement of the one or more layers may be utilized. For example, the first substrate 520 may comprise a buildup layer on one side. In another embodiment, the second substrate 540 may not be required. While FIG. 5 utilized IC module 550, in some embodiments, any other structure may be utilized. For example, one or more dies (not shown) may be provided on the first buildup layer 510 and/or the second buildup layer 530. In one embodiment, the one or more dies may be coupled to the interconnects 512 on the first buildup layer 510. In other embodiments, a different number of dies, substrates, buildup layers, interconnects, modules, signal paths, and arrangements may be used.

Figure 6:
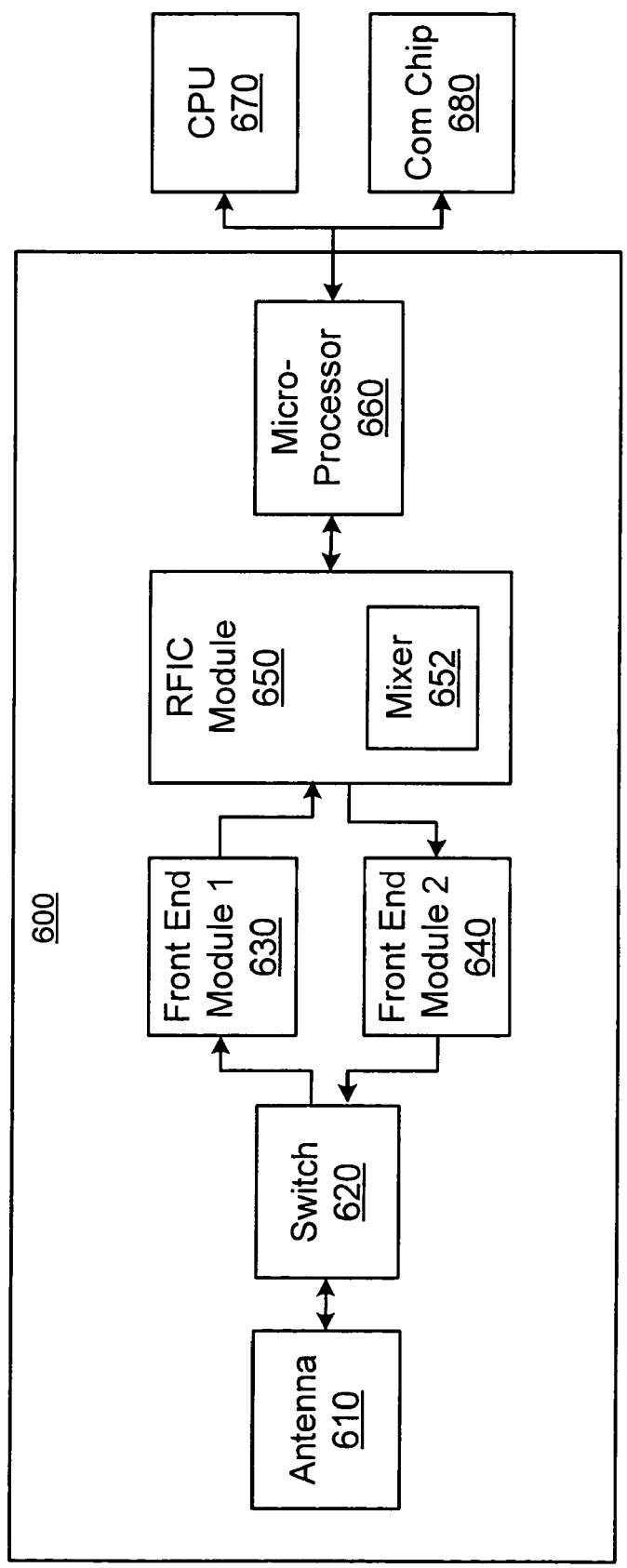
FIG. 6 is a schematic diagram showing an embodiment of a system.

FIG. 6 illustrates an embodiment of a system 600. One or more components in the system 600 may be supported by a substrate (not shown). In one embodiment, the system 600 may comprise one or more antennas 610 to receive and/or transmit one or more signals, e.g., RF signals. The system 600 may further comprise a first front end module (FEM) 630 and a second FEM 640; however, in some embodiments, a different number of FEMs or other modulating modules may be utilized. In one embodiment, the first FEM 630 may modulate signals from the antennas 610. For example, the first FEM 630 may be used to amplify signals received from the antennas 610 and/or filter the signals. The first FEM 630 may comprise a low noise amplifier (LNA) and/or a filter (not shown); however, in some embodiments, the first FEM 630 may comprise a different configuration. In another embodiment, the second FEM 640 may be used to amplify signals to be transmitted via the antennas 610 and/or filter the signals. For example, the second FEM 640 may comprise a power amplifier and/or a filter (not shown); however, in some embodiments, the second FEM 640 may not be limited to these devices.

A switch 620 may be provided to switch between the first and second FEMs 630 and 640. For example, the switch 620 may be switched to transmit signals received from the antennas 610 to the first FEM 630. The switch 620 may further be switched to the second FEM 640, so that signals from the second FEM 640 may be transmitted by the antennas 610. In other embodiment, any other switching circuit may be utilized.

Referring to FIG. 6, the system 600 may comprise a RFIC module 650 that may modulate signals from or to microprocessor 660. In one embodiment, RFIC module 650 may be used to modulate signals from the first FEM 630. For example, the RFIC module 650 may convert signals from the first FEM 630, e.g., high frequency signals into baseband signals or digital signals. In another embodiment, the RFIC module 650 may be used to convert signals from microprocessor 660, e.g., baseband signals or digital signals to produce high frequency signals or analogous signals that may be transferred to the second FEM 640. In one embodiment, the RFIC module 650 may comprise a mixer 652; however, in some embodiments, any suitable configuration or integrated circuits may be utilized.

The microprocessor 660 may process signals from and to the RFIC module 650. For example, the microprocessor 660 may process signals from the RFIC module 650 and transfer the processed signals to CPU 670 or a communication chip 680; however, in some embodiments, the microprocessor 660 may be coupled with any other circuit or module. While the embodiment of FIG. 6 utilizes the microprocessor 660, in some embodiment, any other control may be utilized, such as digital signal processor (DSP), media access controller, baseband controller.

In one embodiment, the system 600 may be provided on a package substrate, e.g., substrate 560 of FIG. 5; however, the components of the system 600 may be disposed on different substrates. For example, the antennas 610 may be provided on a substrate, and the FEMs 630 and 640 and the RFIC 650 may be provided on another substrate. In another embodiment, the substrate where the system 600 or some components thereof locates may be provided with noise absorbing material, e.g., 514, 524 or 534 of FIG. 5. In one embodiment, the noise absorbing material may be used to prevent noise produced by a signal from interfering with other signals. For example, the noise absorbing material may absorb noise from a signal on a signal path in the substrate to prevent the noise from reaching another signal on another signal path.

While certain features of the invention have been described with reference to embodiments, the description is not intended to be construed in a limiting sense. Various modifications of the embodiments, as well as other embodiments of the invention, which are apparent to persons skilled in the art to which the invention pertains are deemed to lie within the spirit and scope of the invention.

What is claimed is:

1. A semiconductor package, comprising:
   a substrate that comprises a first signal path; and
   a first noise absorbing material provided in the substrate to absorb noise from the first signal path;
   a buildup layer attached to the substrate, wherein the buildup layer comprises a second noise absorbing material for the first signal path.

2. The semiconductor package of claim 1, wherein the first noise absorbing material is electrically isolated from the first signal path.

3. The semiconductor package of claim 1, wherein the first noise absorbing material is to surround the first signal path.

4. The semiconductor package of claim 1, wherein the substrate further comprises one or more interconnects, wherein the first noise absorbing material is electrically isolated from each interconnect.

5. The package of claim 1, wherein at least one of the first noise absorbing material and the second noise absorbing material comprises an electromagnetic absorbing material.

6. The package of claim 1, comprising:
   a set of buildup layers coupled to at least one of an upper side and a lower sides of the substrate, wherein the buildup layers comprise a second noise absorbing material to surround an interconnect coupled to the first signal path.

7. The package of claim 1, wherein the first noise absorbing material is to surround the first signal path in a vertical direction.

8. The package of claim 1, wherein the second noise absorbing material is to surround one or more interconnects provided in the buildup layer.

9. The package of claim 8, wherein at least one of the interconnects comprises a via.

10. The package of claim 8, wherein the one or more interconnects couple to the first signal path.

11. A system, comprising:
    a set of antennas to receive and transmit a first signal and a second signal,
    an integrated circuit coupled to the set of antennas to modulate the first signal and the second signal,
    a substrate that couples to the integrated circuit,
    a noise absorbing material provided in the substrate to isolate the first signal from the second signal, and
    a set of modulating modules to amplify the first signal and the second signal, wherein one or more of the set of modulating modules are coupled to the substrate.

12. The system of claim 11, wherein the substrate further comprises one or more buildup layers that are provided with the noise absorbing material to absorb noise from the first signal.

13. The system of claim 11, further comprising:
a buildup layer attached to the substrate, wherein the buildup layer comprises the noise absorbing material to surround a via that couples to the plated through hole.

14. The system of claim 11, wherein at least one of the first signal and the second signal is a radio frequency signal.

* * * * *